United States Patent
Arora et al.

(10) Patent No.: US 11,152,071 B1
(45) Date of Patent: Oct. 19, 2021

(54) ERASE OPERATION REATTEMPT TO RECOVER MISIDENTIFIED BAD BLOCKS RESULTING FROM CONSECUTIVE ERASE FAILURES

(71) Applicant: WESTERN DIGITAL TECHNOLOGIES, INC., San Jose, CA (US)

(72) Inventors: Nikhil Arora, Karnataka (IN); Lovleen Arora, Karnataka (IN); Sourabh Sankule, Karnataka (IN); Sameer Hiware, Karnataka (IN)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 16/885,147

(22) Filed: May 27, 2020

(51) Int. Cl.
  *G11C 16/16* (2006.01)
  *G11C 16/34* (2006.01)
  *G11C 16/14* (2006.01)

(52) U.S. Cl.
  CPC .............. *G11C 16/16* (2013.01); *G11C 16/14* (2013.01); *G11C 16/3404* (2013.01); *G11C 16/349* (2013.01); *G11C 16/3436* (2013.01); *G11C 16/3445* (2013.01)

(58) Field of Classification Search
  CPC ... G11C 16/12; G11C 16/349; G11C 16/3404; G11C 16/3409; G11C 16/0483; G11C 16/16; G11C 16/3445; G06F 12/0246
  See application file for complete search history.

(56) References Cited

U.S. PATENT DOCUMENTS

| 5,627,838 | A  | * | 5/1997 | Lin .......................... G11C 29/44 365/185.09 |
| 6,771,545 | B1 |   | 8/2004 | Hsia et al. |
| 7,196,937 | B2 |   | 3/2007 | Sugio |
| 9,032,264 | B2 |   | 5/2015 | Hashimoto |
| 9,443,616 | B2 |   | 9/2016 | Chen et al. |
| 9,529,663 | B1 |   | 12/2016 | Srinivasan et al. |
| 10,707,226 | B1 | * | 7/2020 | Yang .................. G11C 16/0483 |
| 10,936,456 | B1 | * | 3/2021 | Shur .................... G06F 11/2094 |

(Continued)

OTHER PUBLICATIONS

International Search Report and Written Opinion issued for Int'l Appl. No. PCT/US2021/019992, Int'l Filing date Feb. 26, 2021, dated Jun. 17, 2021.

(Continued)

*Primary Examiner* — Mushfique Siddique
(74) *Attorney, Agent, or Firm* — Arent Fox LLP (57) ABSTRACT

Aspects of a storage device including a controller are provided which recovers misidentified bad blocks that fail to erase due to charge leakage from a previously programmed open block. The controller programs an open block, and attempts to erase a plurality of closed blocks following the programming of the open block. When the closed blocks fail to erase, the controller marks the closed blocks as bad blocks. The controller then determines whether a number of consecutive erase failures after programming the open block meets a threshold, in response to which the controller resets a die including the closed blocks and reattempts to erase the closed blocks. The controller then unmarks as bad blocks the closed blocks which successfully erased in response to the re-attempt.

19 Claims, 7 Drawing Sheets

(56) References Cited

U.S. PATENT DOCUMENTS

| | | | |
|---|---|---|---|
| 2002/0054528 A1 | 5/2002 | Tabata et al. | |
| 2005/0141312 A1* | 6/2005 | Sinclair | G06F 11/1072 |
| | | | 365/222 |
| 2008/0071969 A1 | 3/2008 | Lin | |
| 2010/0246265 A1* | 9/2010 | Moschiano | G11C 11/5635 |
| | | | 365/185.11 |
| 2014/0269069 A1* | 9/2014 | D'Abreu | G11C 16/06 |
| | | | 365/185.11 |
| 2015/0033087 A1 | 1/2015 | Marquart et al. | |
| 2016/0343449 A1* | 11/2016 | Lee | G11C 11/5635 |
| 2018/0285562 A1 | 10/2018 | Radhakrishnan et al. | |
| 2018/0342304 A1 | 11/2018 | Dunga et al. | |
| 2019/0034290 A1 | 1/2019 | Guo et al. | |
| 2019/0066802 A1 | 2/2019 | Malshe et al. | |
| 2019/0164614 A1* | 5/2019 | Prasad | G11C 29/028 |
| 2019/0354476 A1* | 11/2019 | Park | G06F 12/0246 |
| 2020/0004453 A1* | 1/2020 | Roh | G06F 12/0246 |

OTHER PUBLICATIONS

U.S. Non-Final Office Action issued for U.S. Appl. No. 16/885,160, filed May 27, 2020, dated Jul. 9, 2021.

U.S. Final Office Action issued for U.S. Appl. No. 16/885,160, filed May 27, 2020, dated Sep. 8, 2021.

* cited by examiner

FIG. 1

- PRIOR ART -

ERASE OPERATION REATTEMPT TO RECOVER MISIDENTIFIED BAD BLOCKS RESULTING FROM CONSECUTIVE ERASE FAILURES

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When writing data to an open block (i.e. an un-programmed or partially programmed block) of the flash memory, the flash storage device may identify the physical address of the block associated with the logical address in which the data is to be stored, and may then write the data to the open block at the identified physical address. When the open block becomes fully programmed (i.e. a closed block), the flash storage device may erase existing data in the closed block and then write additional data to the now-erased (open) block. Similarly, the flash storage device may erase data in other closed blocks before writing additional data to those blocks as well.

However, in some cases after programming the open block, the flash storage device may experience back-to-back (i.e. consecutive) erase failures when attempting to erase the other closed blocks. As a result, these closed blocks may be identified as grown bad blocks (GBBs), even though the closed blocks may actually be good blocks in other situations (e.g. the blocks may have been successfully erased prior to programming the open block). Over time, if the entire population of closed blocks is identified as GBBs due to such erase failures, the flash storage device may enter a read-only (RO) mode, preventing further data writes to the flash memory.

SUMMARY

One aspect of a storage device is disclosed herein. The storage device includes a controller. The controller is configured to program an open block, and to attempt to erase a plurality of closed blocks following the programming of the open block. In response to a number of consecutive erase failures after programming the open block meeting a threshold, the controller is further configured to reattempt to erase the closed blocks.

Another aspect of a storage device is disclosed herein. The storage device includes a controller. The controller is configured to program an open block, to attempt to erase a plurality of closed blocks after programming the open block, and to mark the plurality of closed blocks as bad blocks when the attempt to erase the plurality of closed blocks fails. In response to a number of consecutive erase failures after programming the open block meeting a threshold, the controller is further configured to re-attempt to erase the plurality of closed blocks and unmark the plurality of closed blocks as bad blocks in response to a successful re-attempt to erase the plurality of closed blocks.

A further aspect of a storage device is disclosed herein. The storage device includes a controller. The controller is configured to program an open block, to attempt to erase a plurality of closed blocks after programming the open block, and to mark the plurality of closed blocks as bad blocks when the attempt to erase the plurality of closed blocks fails. In response to a number of consecutive erase failures after programming the open block meeting a threshold, the controller is further configured to re-attempt to erase the closed blocks, and to unmark as bad blocks each one of the closed blocks that is successfully erased.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a controller of the storage device writes data into memory, the controller generally programs data into an open block. When the open block is full (i.e. becomes a closed block), the controller may erase the closed block prior to programming new data. Similarly, the controller may erase other closed blocks in order to write additional data to those blocks. However, due to shared signal lines (e.g. bit lines) between blocks of a same die, programming data into the open block may result in back-to-back erase failures when the controller attempts to subsequently erase data in the other closed blocks. For instance, after the controller completes a program operation for an open block, in some cases the open block may not be deselected properly before the controller attempts to erase a closed block. As a result, charge leakage from the open block may unexpectedly flow down the bit line into the other closed blocks, affecting the threshold voltages of cells in the closed blocks and preventing erase operations from successfully occurring in those closed blocks. In response to this block-to-block disturb effect causing the erase operation to be unsuccessfully performed, the controller may identify the closed block as a GBB and then attempt to erase another closed block in the die instead. However, this subsequent erase operation may also result in erase failure for similar reasons, the other closed block may be similarly identified as GBB, and the cycle may repeat. Accordingly, consecutive erase failures may occur when the controller attempts to erase the closed blocks, one after the other, following programming of the open block (i.e. an aggressor block or trigger block) until a power-on-reset (POR) of the die.

After a large number of erase blocks are consecutively identified as GBBs due to the aggressor block, the storage device may eventually enter a RO mode due to block unavailability. When the storage device is in the RO mode, the controller may not write data into memory, and is limited to reading existing valid data in the memory. Such decreased performance may occur any time during the life of the storage device (e.g. after performing a programming operation in an aggressor open block and switching to an erase operation in a closed block), including the beginning of life (BOL) of the drive. Although closed blocks which fail to erase may be filtered or screened out of products during manufacturing and stress testing, such approach may result in reduced yields by removing otherwise good blocks (e.g. closed blocks which would have successfully erased without the aggressor block) and by reducing the number of available blocks in a die such that the die is no longer acceptable for use in such products. Moreover, such approach may result in added testing time and costs to screen for these defects, as well as result in increased DPPM of products where such defects are overlooked.

To minimize the likelihood of entry into RO mode due to back-to-back erase failures following the programming of an aggressor block, the storage device described in the present disclosure identifies closed blocks which were erroneously identified as bad blocks in response to consecutive erase failures caused by the aggressor block, and unmarks those closed blocks from being GBBs to enable access to those otherwise good blocks. The storage device described in the present disclosure also identifies the aggressor open block which caused the erase failures in the closed blocks, and marks the aggressor block as a GBB to prevent access to that defective block. In this way, good closed blocks that may otherwise have been screened out as defects during manufacturing or testing may be reclaimed and used in memory-based products, providing yield improvement and reducing test time and costs associated with screening and stress tests for such defects. Additionally, aggressor blocks causing such defects may be removed from the available blocks of memory, improving storage device performance during run time.

Figure 1:
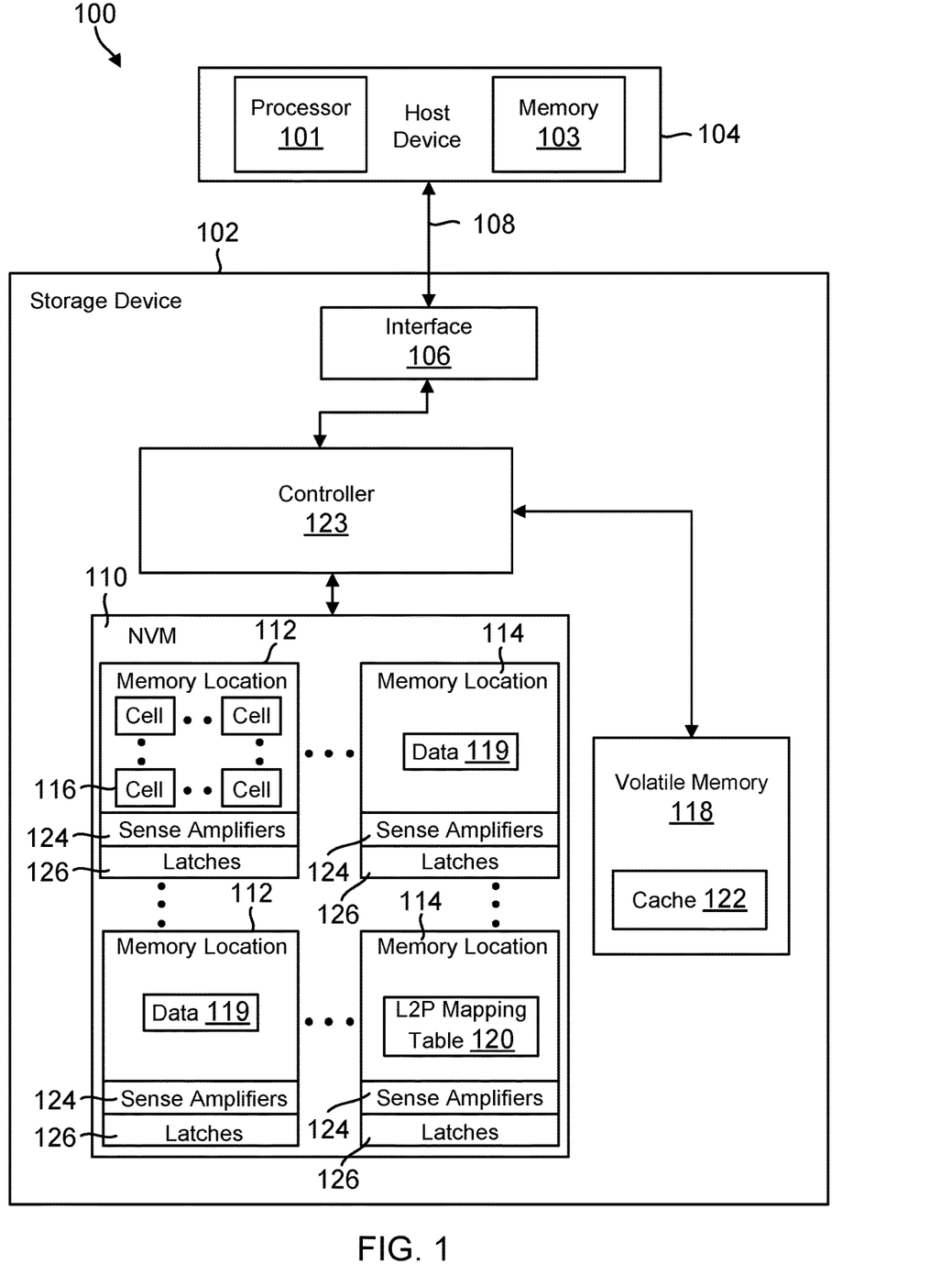
FIG. 1 is a block diagram illustrating an exemplary embodiment of a storage device in communication with a host device.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103.

The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
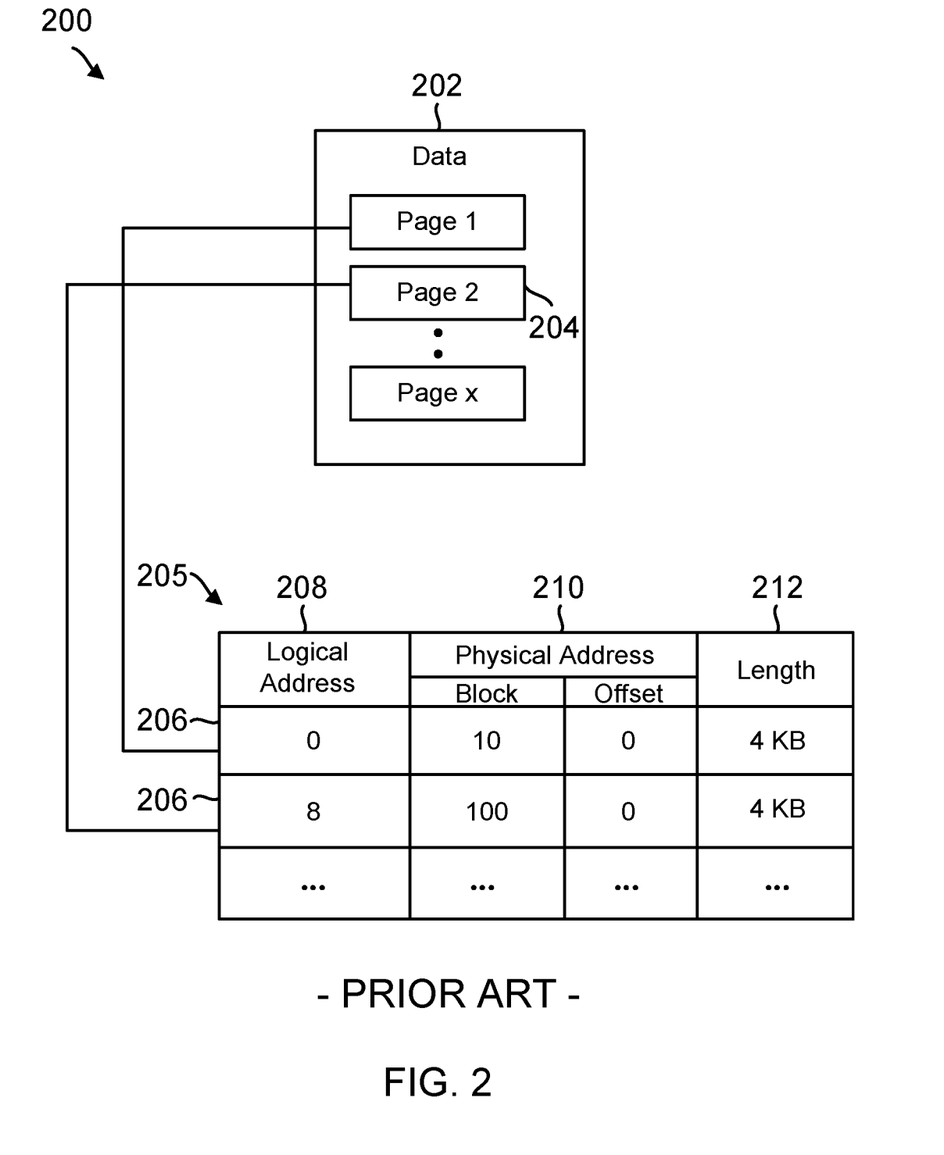
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
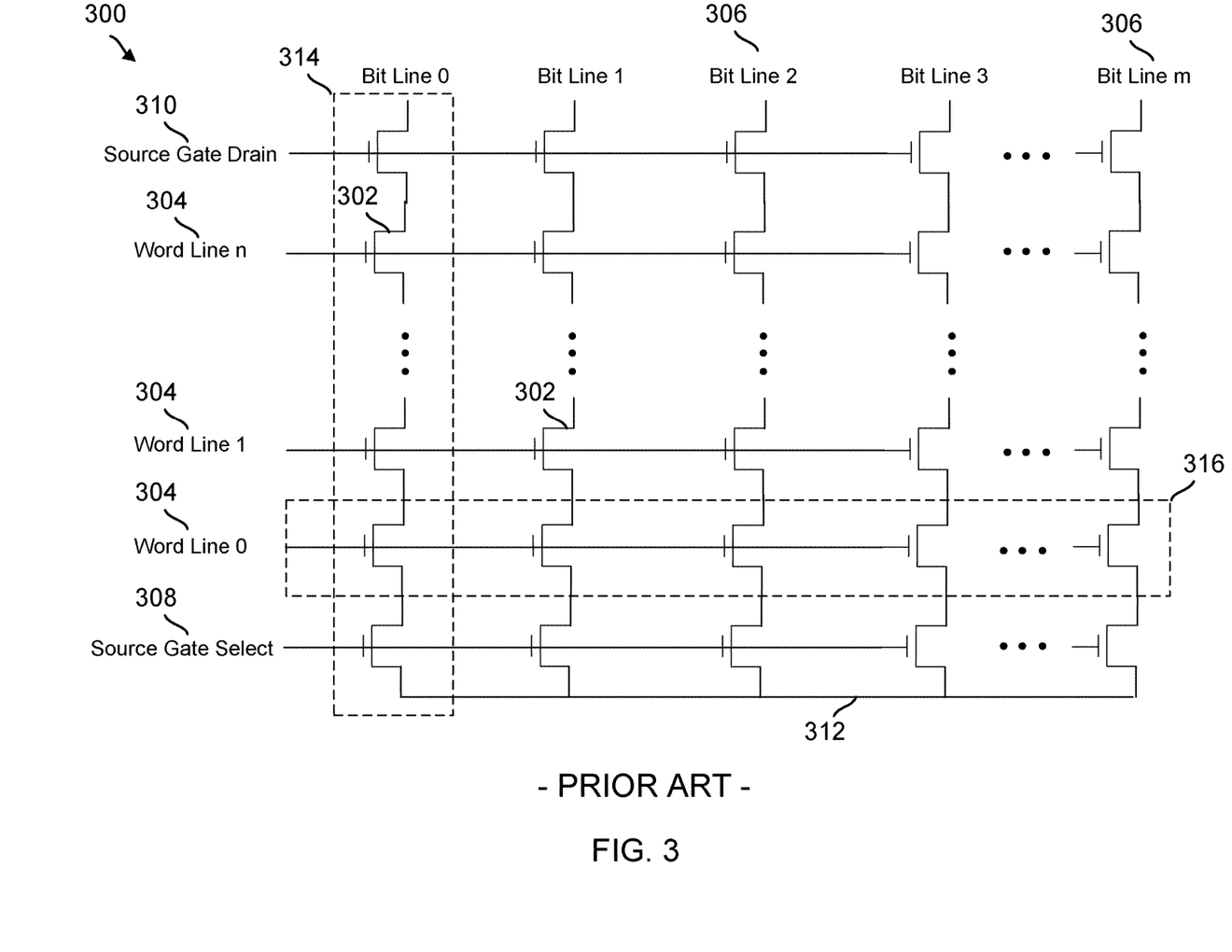
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block 114 of the NVM 110, where n and m are predefined according to the size of the block. Source gate select (SGS) cells 308 and source gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
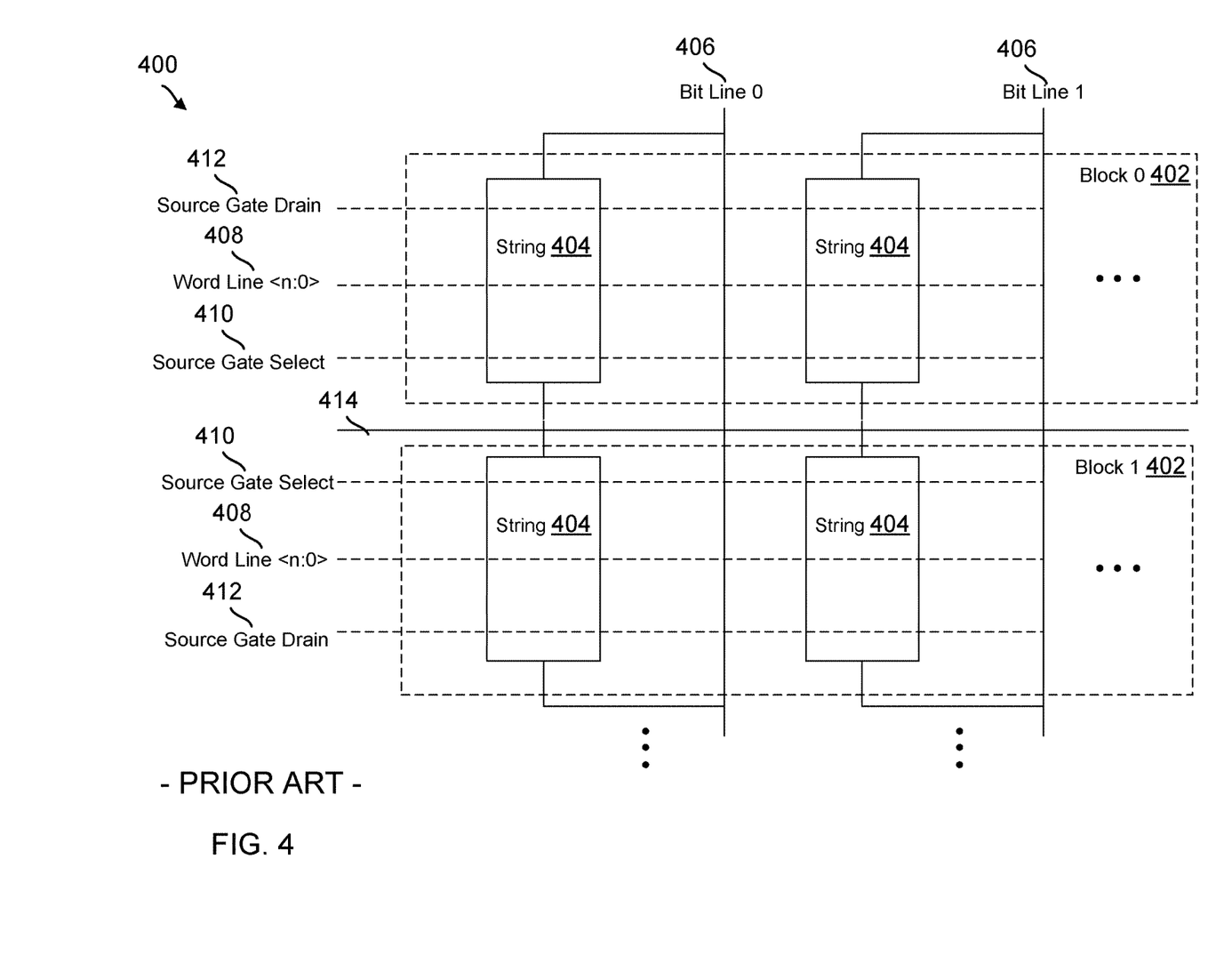
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by applying the program voltage to the cell 302 on the word line 304, 408 until the cell reaches the threshold voltage, and during an erase operation, the controller may apply an erase voltage to the block 402 including the cells 302 (e.g. to a substrate of the cells such as a p-well) until the cells reduce back below the threshold voltage (back to logic '1').

Figure 5:
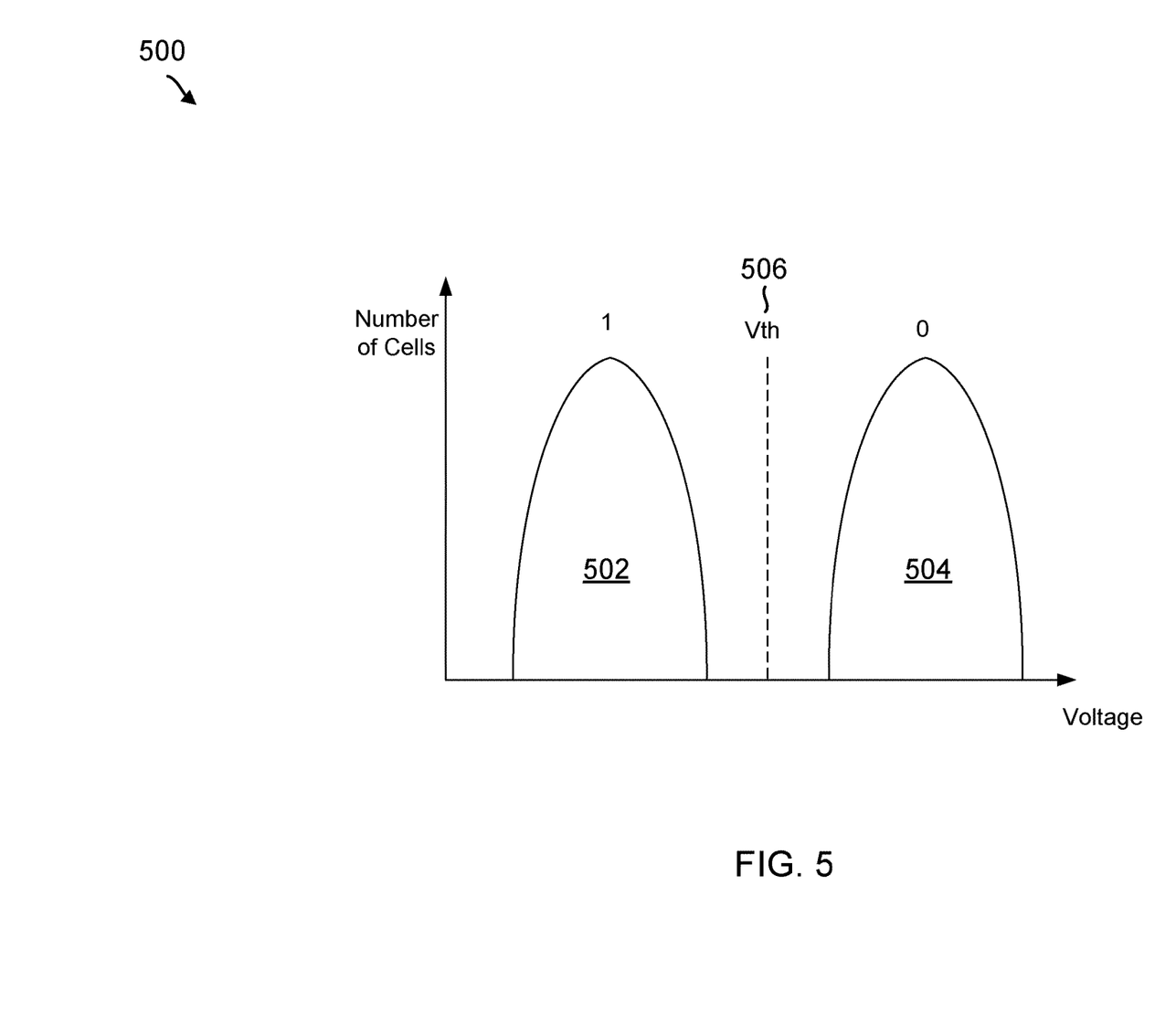
FIG. 5 is a graphical diagram illustrating an example of a voltage distribution chart for single-level cells in the storage device of FIG. 1.

FIG. 5 illustrates an example of a voltage distribution chart 500 illustrating different NAND states for SLCs (e.g. cells 116, 302) storing one bit of data (e.g. a logic 0 or 1). The SLCs may be in an erase state 502 corresponding to logic '1', or a program state 504 corresponding to logic '0'. Initially, the cells 116, 302 may be in the erase state 502, e.g. after the controller 123 erases a block 114, 402 including the cells. While FIG. 5 illustrates two NAND states for SLCs (e.g. logic 0 and logic 1), the number of states may be different depending on the amount of data that is stored in each cell 116, 302. For example, MLCs may have four states (e.g. logic 00, 01, 10, 11), TLCs may have eight states, and QLCs may have sixteen states.

When the controller 123 attempts to program cells of a selected word line in a selected, open block into a program state 504, the controller generally performs incremental step pulse programming (ISPP) over a number of programming loops or ISPP cycles. For example, the controller may apply a programming voltage (e.g. a high voltage) to the selected word line 304, 408, a pass through voltage (e.g. a high voltage lower than the programming voltage) to the other word lines 304, 408, a high voltage to the SGD 310, 412 and a low voltage to the SGS 308, 410 of the string 404 including the selected word line to select the open block, a bit line program voltage (e.g. a low voltage) on the bit lines 306, 406 connected to the selected cells being programmed on the selected word line, and a bit line inhibit voltage (e.g. a high voltage) on the bit lines 306, 406 connected to the other cells not being programmed on the selected word line. Applying a high programming voltage to the selected word line allows electrons to tunnel from the channel into the charge trapping layer of those cells, thereby causing the threshold voltage of the cells to increase. After the programming voltage is applied, the controller applies a program verify voltage (e.g. a low voltage) to the word line 304, 408 to determine whether the threshold voltage of the cells exceeds a threshold voltage 506 corresponding to the program state 504. If the threshold voltage of the cells does not exceed the threshold voltage 506, the controller may determine that the cells 302 are still in the erase state 502. Accordingly, in the next programming loop or ISPP cycle, the controller may apply a higher programming voltage to further increase the threshold voltage of the cells, and then again may apply a program verify voltage to determine whether the new threshold voltage exceeds the threshold voltage 506. The controller may similarly repeat the above process of incrementally increasing the programming voltage and verifying the voltage threshold of the selected cells over a number of programming loops. If the threshold voltage of the cells exceeds the threshold voltage 506 and the total number of programming loops does not exceed a predetermined loop count, the controller may determine that the cells have entered the program state 504 and are thus successfully programmed. After completing the programming operation, the controller may deselect the open block by changing the gate voltage applied to the SGD 310, 412 or SGS 308, 410 of the string 404 including the selected word line.

Similarly, when the controller 123 attempts to erase cells of a closed block into an erase state 502, the controller generally performs incremental step pulse erasing (ISPE) over a number of erase loops or ISPE cycles. For example, the controller may apply an erase voltage (e.g. a high voltage) to the substrates (e.g. the p-well) of the cells 302 in the selected block 114, 402, a low voltage (e.g. ground) to the word lines 304, 408 coupled to the cells 302 in the selected block, and allow the SGD 310, 412 or SGS 308, 410 of the strings 404 in the selected block to remain floating. Applying a high erase voltage to the substrate/p-well allows holes to tunnel from the channel into the charge trapping layer (or electrons to exit the charge trapping layer into the channel) of the cells in the block, thereby causing the threshold voltage of the cells to decrease. After the erase voltage is applied, the controller applies a erase verify voltage (e.g. a low voltage) to the word line 304, 408 to determine whether the threshold voltage of the cells reduced below the threshold voltage 506. If the threshold voltage of the cells does not reduce below the threshold voltage 506, the controller may apply a higher erase voltage in a subsequent ISPE loop to further decrease the threshold voltage of the cells, and then again may apply an erase verify voltage to confirm whether the new threshold voltage has reduced below the threshold voltage 506. The controller may similarly repeat the above process over a number of erase loops until the controller determines the block has been successfully erased.

However, in some cases, when the controller completes programming of an open block in a die and attempts to subsequently erase closed blocks in the same die as described above, the closed blocks may fail to erase due to improper deselection of the open block (based on block-to-block disturb). For instance, when the controller applies a program voltage to the selected word line of the open block, program disturb may affect the threshold voltage of the SGD 310, 412 or SGS 308, 410 adjacent to the programmed cell in the string 314, 404 of the open block. Thus, when the controller attempts to deselect the SGD or SGS in the open block after the programming (e.g. by changing the gate voltage applied to the SGD or SGS), the SGD or SGS may unexpectedly remain in an active state due to the affected threshold voltage. As a result, charge leakage or current from the cells in the open block may flow down the bit line 306, 406 to cells in other closed blocks of the die, affecting the threshold voltage of the cells 302 in those blocks 402 and preventing erase operations from subsequently occurring in those blocks 402. For example, when the controller performs ISPE to erase the cells of one closed block, one or more cells in the block may not successfully transition into the erase state 502 within the maximum number of ISPE cycles (e.g. an erase timeout may occur). As a result, the controller may determine that an erase failure has occurred, and the controller may identify the closed block which failed to erase as a GBB. Moreover, when the controller attempts to subsequently erase the cells of another closed block in the die, another erase failure may similarly occur due to the charge leakage, after which the controller may identify the other closed block which failed to erase as another GBB. The above process may repeat for subsequent closed blocks, resulting in consecutive erase failures and marking of these blocks as GBBs until a RO mode occurs.

Figure 6:
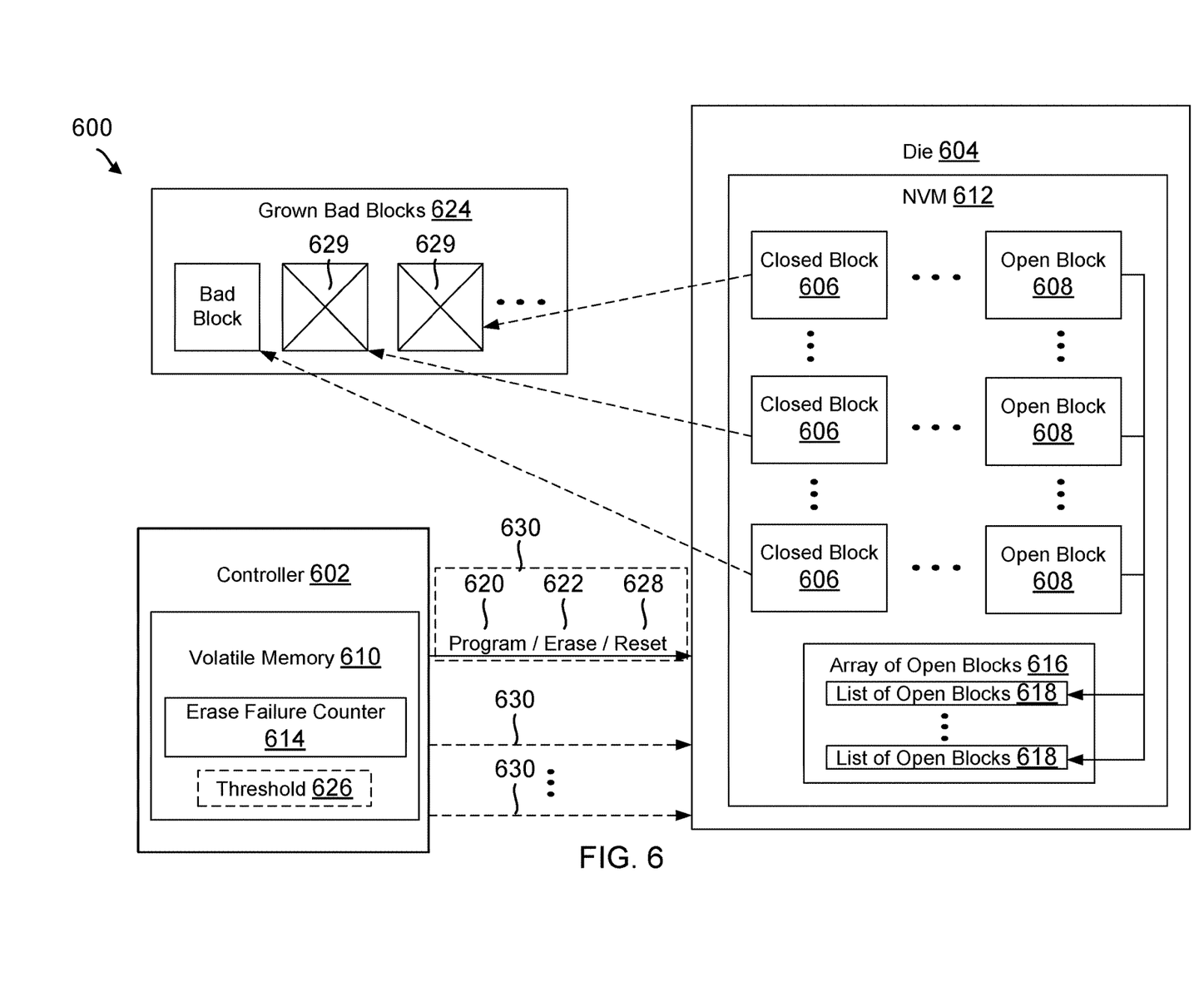
FIG. 6 is a conceptual diagram illustrating an example of a controller that programs and erases data in blocks of a die within the storage device of FIG. 1.

The storage device described in the present disclosure may address this problem by allowing the controller to detect the closed blocks in a die which resulted in erase failure due to an aggressor block (i.e. the open block), and identify the aggressor block in the die that caused the erase failures. Accordingly, FIG. 6 illustrates an example diagram 600 of a controller 602 in communication with a die 604 over a bus. The die 604 may include a plurality of closed blocks 606 and open blocks 608. The controller 602 may correspond to controller 123 of FIG. 1 and may include a volatile memory 610 corresponding to the volatile memory 118 of FIG. 1, and the die 604 may include a NVM 612 corresponding to the NVM 110 of FIG. 1. The NVM 612 may include the closed blocks 606 and open blocks 608, which may correspond to blocks 114, 402 of FIGS. 1 and 4.

In one approach, during format or initialization of the storage device, the controller 602 may initialize an erase failure counter 614 (e.g. set the value to 0) and initialize an array of open blocks 616 (e.g. of size m×m, where m is a predefined number) which may store lists 618 of open blocks in the NVM 612. When the controller receives data (e.g. data 119) in a write command from a host device (e.g. host device 104), the controller may perform a program operation 620 in which the controller programs the data in one of the open blocks 608 as described above (e.g. using ISPP). Afterwards, the controller may attempt to perform an erase operation 622 in one of the closed blocks 606 as described above (e.g. using ISPE). If the erase operation fails due to block-to-block disturb caused by one of the open blocks 608 as previously described, the controller may perform erase failure handing for this first closed block, e.g. by identifying the unsuccessfully erased closed block as a bad block 624 (GBB).

The controller may then determine whether the erase failure which occurred is a consecutive erase failure. A failure to erase a closed block may be considered a consecutive erase failure if a preceding erase operation in another closed block also resulted in erase failure. In this example, the failed erase operation for the closed block was an initial erase operation following the programming of the open block. Thus, the controller may determine that the failed erase operation in this example is not a consecutive erase failure, and may accordingly refrain from updating the erase failure counter 614.

After identifying the first closed block as a GBB 624, the controller may attempt to similarly perform another erase operation 622 in another of the closed blocks 606. If the other erase operation fails again due to the block-to-block disturb, the controller may again perform erase failure handing for this second closed block (e.g. identifying the other closed block as a GBB 624). However, in this example, the controller may detect that the erase failure of the second closed block is a consecutive erase failure, since the failed erase operation for the second closed block followed the failed erase operation for the first closed block, and therefore the controller may update (e.g. increment) the erase failure counter 614. The controller may also attempt to similarly perform another erase operation 622 in a third closed block, and if a failure again occurs, the controller may identify the third closed block as a GBB 624 and update the erase failure counter 614 again in response to another detected consecutive erase failure. The controller may repeat the process of attempting to erase closed blocks any number of times while updating the erase failure counter 614 accordingly. If a subsequent erase operation happens to succeed, the controller may reset the erase failure counter 614 and repeat the aforementioned process.

After each erase operation or erase failure counter update, the controller may check whether the value of the erase failure counter 614 meets a threshold 626. The threshold 626 may be a predefined number of consecutive erase failures, which may be based on a maximum number of erase failures allowed by the storage device 102 without resulting in RO mode. The threshold may be stored in the volatile memory 610 or elsewhere. If the erase failure counter 614 meets the threshold 626, the controller 602 may perform a reset operation 628 by sending a reset command (e.g. an 'FFh' command) to the die 604. The reset operation 628 may reset the blocks 606, 608 of the die, including deselecting or deactivating any SGDs 310, 412 or SGS 308, 410 in the strings 314, 404 of the blocks. After resetting the die 604, the controller may re-attempt to erase the closed blocks 606 which failed to erase during the last E operations, where E is the number of consecutive erase failures indicated by the erase failure counter 614. For example, if the erase failure counter 614 includes the value "3" at this time, the controller may re-attempt to perform an erase operation 622 for the last three closed blocks which failed to erase before resetting the die 604.

When the controller 602 re-attempts the erase operation 622 for the closed blocks 606 which previously failed to erase, the controller may successfully erase the closed blocks after the reset operation 628 if the consecutive erase failures had resulted from the block-to-block disturb effect caused by the previously programmed open block. For example, the reset may properly deselect the SGDs or SGS in the previously programmed open block as indicated above, resulting in a successful erase operation for these closed blocks. As a result, the controller may unmark as GBBs the closed blocks 606 which successfully erased. For instance, in the example illustrated in FIG. 6, two of the three closed blocks which previously failed to erase resulted in a successful re-attempted erase operation, and thus the controller may determine that these blocks are misidentified bad blocks 629 and may unmark these blocks from being GBBs 624 accordingly. In other examples, any number of the closed blocks may be unmarked as GBBs in response to a successful re-attempted erase operation. The recovered or unmarked bad blocks may then be available to be used again in the storage device.

Additionally, after determining that the re-attempted erase operation succeeds for at least one of the erase blocks, the controller 602 may identify that an aggressor block (i.e. one of the open blocks 608) resulted in the previous erase failures of the closed blocks. In order to identify which open block is the aggressor block out of the population of open blocks 608, the controller performs the aforementioned process a number or plurality of times 630 (i.e. the program operation 620 of the open block, the erase operation 622 of a plurality of closed blocks 606, the reset operation 628 of the die 604, and a successful re-attempted erase operation for at least one of the closed blocks 606), and stores a list of open blocks 618 in the array of open blocks 616 each time 630. For example, after each program, erase, reset, and successful re-attempted erase operation, the controller may include an identifier for every currently open block in the die 604 within a list of open blocks 618, and store that list of open blocks 618 in a next available memory location of the array.

After performing the aforementioned process a number of times 630 or iterations (e.g. at least two times, such that the array 616 includes at least two lists of open blocks from different times), the controller may check the array of open blocks 616 to determine if any of the stored lists of open blocks 618 include a single common open block between the stored lists. If the controller determines that two or more common open blocks between the stored lists are included in the array, the controller may not have sufficient information to determine which of those common open blocks is the aggressor block that caused the erase failures. As a result, the controller may reset the erase failure counter 614, repeat another iteration of the aforementioned process, add another list of currently open blocks 618 to the array of open blocks 616, and check the array again to determine whether a single common open block exists between the lists. The controller may repeat this process until the controller determines that a single common open block exists between the lists, which indicates that common block to be the aggressor block. In such case, the controller may mark the aggressor block as a GBB 624 and remove it from the population of available open blocks 608, after which the controller may reset the array of open blocks 616 and continue to perform program and erase operations as discussed. Accordingly, performance of the storage device may be improved during its life due to removal of the aggressor block, thereby reducing the likelihood of back-to-back erase failures of otherwise good blocks.

As an example, assume for ease of explanation that the die 604 includes a total of five currently open blocks 608 with the following unique identifiers: 1, 2, 3, 4, and 5, although other identifiers (e.g. numeric or alphanumeric) and numbers of open blocks may be used in other examples. Moreover, in this example, assume open block '2' is the aggressor block. During one time 630 or iteration, the controller 602 partially programs any number of open blocks including the block with identifier '2', and experiences consecutive erase failures with closed blocks 606 following programming of the open blocks. If the controller successfully re-attempts to erase at least one of the closed blocks following a reset of the die (when the value of the erase failure counter 614 meets the threshold 626), the controller stores the current open block identifiers of 1, 2, 3, 4, and 5 as a first list of open blocks in the array of open blocks 616. Since at this stage there is only one list of open blocks 618, the controller does not compare this list to another list to identify a common open block.

Accordingly, the controller repeats the aforementioned process during another time 630 or iteration, where the controller 602 again programs any number of open blocks, experiences consecutive closed block erase failures afterwards, subsequently resets the die, and successfully re-attempts to erase at least one of the closed blocks after resetting the die. In this example, assume in the interim that the controller fully programmed open blocks '3', '4', and '5' (i.e. they are now closed blocks), successfully erased blocks '6', '7', and '8' (i.e. they are now open blocks), and again partially programmed open block '2'. As a result, the die 604 includes the following currently open blocks 608 with the following unique identifiers: 1, 2, 6, 7, 8, and so the controller stores this list as a second list of open blocks in the array of open blocks 616. Since there are multiple lists of open blocks 618, the controller checks whether there is one common open block between the lists, and determines in this example there are two common open blocks (i.e. with identifiers '1' and '2') between the two lists (i.e. between 1, 2, 3, 4, 5 and 1, 2, 6, 7, 8). Therefore, the controller does not identify an aggressor block at this time.

Subsequently, the controller again repeats the aforementioned process during another time 630 or iteration, where in this example, the controller fully programmed open block '1' (i.e. it is now a closed block), partially programmed open block '2' again, and experienced subsequent consecutive erase failures. Accordingly, the die 604 includes the following open blocks at this time: 2, 6, 7, 8, which the controller stores as a third list of open blocks in the array 616. The controller again checks whether there is a common open block between the multiple lists, and determines there is one common open block (i.e. with identifier '2') between the three lists (i.e. between 1, 2, 3, 4, 5 and 1, 2, 6, 7, 8 and 2, 6, 7, 8). As a result, the controller identifies open block '2' as the aggressor block.

Figure 7:
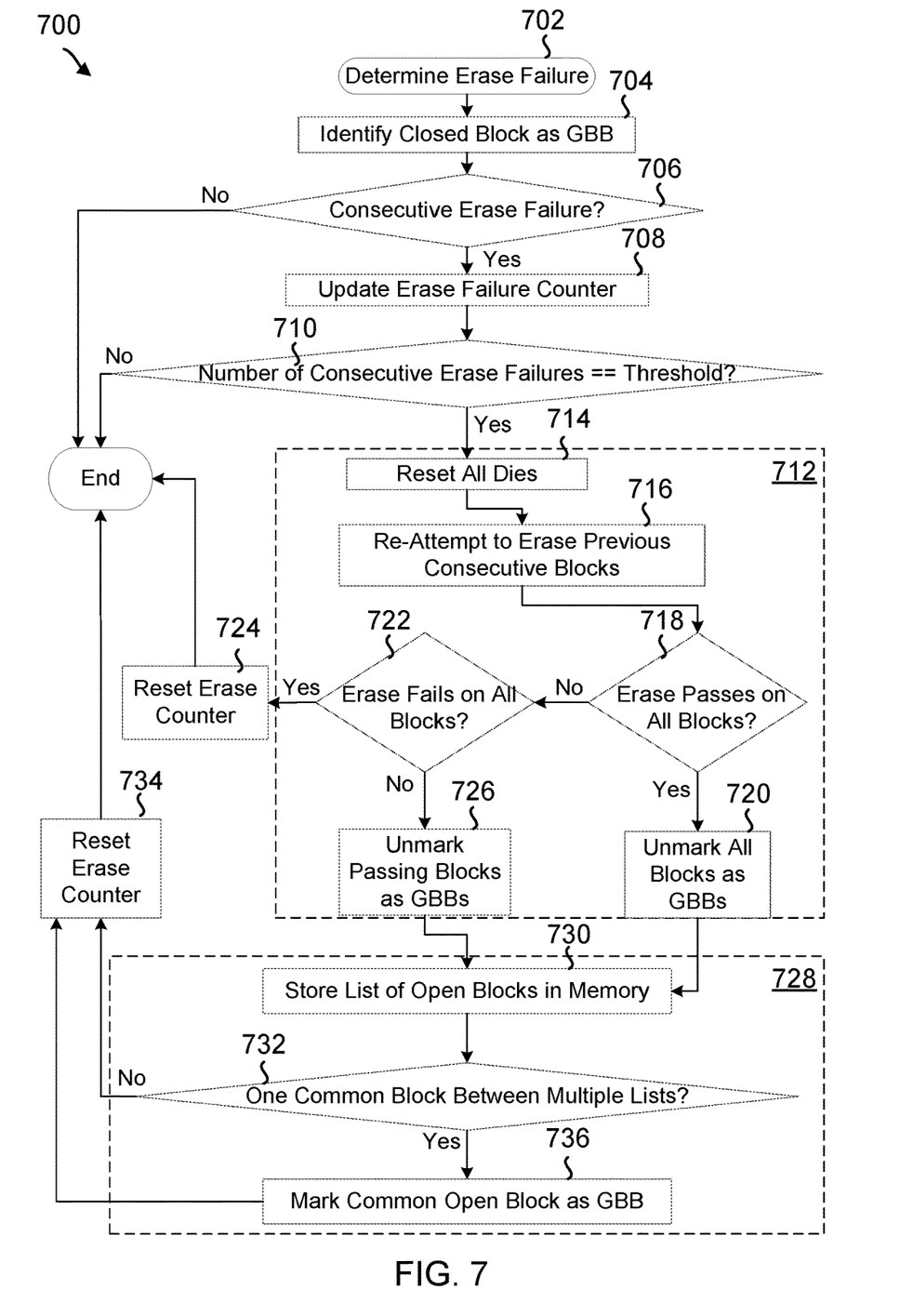
FIG. 7 is a flow chart illustrating a method for unmarking misidentified bad blocks in response to erase failures due to an open block, and for detecting the open block causing the erase failures, which is performed by the storage device of FIG. 1.

FIG. 7 illustrates an example flow chart 700 of a method for unmarking misidentified bad blocks in response to erase failures due to an aggressor block, and for detecting the aggressor block causing the erase failures. For example, the method can be carried out in a storage device 102 such as the one illustrated in FIG. 1. Each of the steps in the flow chart can be controlled using the controller as described below (e.g. controller 123, 602), or by some other suitable means.

As represented by block 702, the controller may determine that an erase failure occurred in response to an attempt to erase a closed block. For instance, referring to FIG. 6, after performing a program operation 620 for an open block 608, the controller may perform an erase operation 622 attempting to erase a closed block 606 (e.g. using ISPE). However, due to the block-to-block disturb effect caused by charge leakage (e.g. on bit lines 306, 406) following programming of the open block 608, the attempt to erase the closed block 606 may fail, for example, if the closed block fails to transition to the erase state 502 within a predetermined loop count.

As represented by block 704, the controller may perform erase failure handling for the closed block. For instance, referring to FIG. 6, after determining an erase failure has occurred on the closed block 606, the controller may identify the block as a GBB 624.

As represented by block 706, the controller may determine whether a consecutive erase failure has occurred. For example, referring to FIG. 6, the controller may check whether the erase failure determined at 702 in response to an attempted erase operation 622 followed a previous erase operation which also failed to erase one of the closed blocks 606. If the erase failure determined at 702 is the first erase failure following programming of an open block (i.e. it is not a consecutive erase failure), then the controller stops the process. On the other hand, if the erase failure determined at 702 is not the first erase failure following programming of an open block (i.e. it is a consecutive erase failure), then as represented by block 708, the controller may update an erase failure counter indicating the current number of consecutive erase failures. For example, referring to FIG. 6, the controller may increment the erase failure counter 614 in response to the failed erase operation 622.

Next, as represented by block 710, the controller may determine whether a number of consecutive erase failures that have occurred meets a threshold. For example, referring to FIG. 6, the controller may check whether the value of the erase failure counter 614 is equal to the threshold 626. If the number of consecutive erase failures does not meet the threshold (i.e. the controller failed to erase a closed block less than the threshold number of times following programming of the open block), the controller stops the process.

Otherwise, if the number of consecutive erase failures meets the threshold (i.e. the controller failed to erase a closed block the threshold number of times following programming of the open block), then the controller may recover incorrectly marked GBBs as represented by block 712, described in more detail below. For example, as represented by block 714, the controller may first reset the dies in the storage device. For instance, referring to FIG. 6, the controller may perform a reset operation 628 to reset the dies 604 of the storage device. Afterwards, as represented by block 716, the controller may re-attempt to erase the previous closed blocks which failed to erase. For example, referring to FIG. 6, the controller may re-attempt another erase operation 622 on the closed blocks 606 which were determined to result in erase failure back at block 702 following programming of the open block 608. The controller may then determine, as represented by block 718, whether the re-attempted erase operation succeeded on all of the closed blocks. If so, then as represented by block 720, the controller may unmark the successfully erased closed blocks as GBBs. For example, referring to FIG. 6, the controller may determine that all of the closed blocks 606 which previously failed to erase now successfully erased following the reset operation 628, and therefore the controller may determine that these blocks were misidentified bad blocks 629 and accordingly unmark them as GBBs 624. On the other hand, if the controller determines at block 718 that at least one of the closed blocks failed to successfully erase after the re-attempt, then as represented by block 722, the controller may determine whether the re-attempted erase operation failed on all of the closed blocks. If so, then as represented by block 724, the controller may reset the erase failure counter (e.g. set erase failure counter 614 back to 0), and stops the process. Otherwise, if the controller determines at block 722 that the re-attempted erase operation failed on some (but not all) of the closed blocks, then then as represented by block 726, the controller may unmark the successfully erased closed blocks as GBBs (similarly as described above with respect to block 720).

If at least one incorrectly marked GBB was recovered (i.e. the controller performed unmarking of at least one GBB at either blocks 720 or 726), then the controller may detect the aggressor open block which caused the incorrectly marked GBB(s) as represented by block 728, described in more detail below. For example, as represented by block 730, the controller may store a list of currently open blocks in memory. For instance, referring to FIG. 6, the controller may store the list of currently open blocks 618 in a next available row of the array of open blocks 616. Then, as represented by block 732, the controller may determine whether exactly one common block exists between multiple stored lists of open blocks. For instance, referring to FIG. 6, the controller may compare multiple lists of open blocks 618 in the array of open blocks 616 to determine if there is one common open block between the lists. If only one list of open blocks is stored in the array at this time (i.e. it is the first time aggressor block detection at block 728 is being performed), or if there are multiple lists of open blocks stored in the array (i.e. it is at least the second time aggressor block detection at block 728 is being performed) but there is more than one open block common between the multiple lists, then the controller may reset the erase failure counter at block 734 and stop the process. Otherwise, if the controller determines at block 732 that there is only one common open block between multiple lists of open blocks, then as represented by block 736, the controller may identify and mark the common open block as a GBB, reset the erase failure counter at block 734 (as well as reset the array of open blocks 616), and stop the process.

Accordingly, the storage device described in the present disclosure allows for recovery of incorrectly marked GBBs and detection of an aggressor open block which caused the incorrectly marked GBBs. In this way, good closed blocks that may otherwise have been screened out as defects during manufacturing or testing may be reclaimed and used in memory-based products, providing yield improvement and reducing test time and costs associated with screening and stress tests for such defects. Additionally, aggressor blocks causing such defects may be removed from the available blocks of memory, improving storage device performance during run time.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory including non-volatile memory; and
a controller coupled to the memory and comprising at least one processor that is configured to execute instructions stored in the memory that causes the at least one processor to:
program an open block of the non-volatile memory,
perform an attempt to erase a plurality of closed blocks of the non-volatile memory after programming of the open block,
mark one or more of the plurality of closed blocks that fail to erase as bad blocks,
determine a number of consecutive erase failures based on the attempt to erase the plurality of closed blocks,
perform a re-attempt to erase the plurality of closed blocks when the number of consecutive erase failures meets a threshold, and
unmark the one or more of the plurality of closed blocks identified as bad blocks that successfully erase based on the re-attempt.

2. The storage device of claim 1, wherein the at least one processor is further configured to update an erase failure counter indicating the number of consecutive erase failures in response to a failed attempt to erase one of the plurality of closed blocks.

3. The storage device of claim 2, wherein the at least one processor is further configured to reset the erase failure counter after the re-attempt to erase the plurality of closed blocks.

4. The storage device of claim 1, wherein the memory comprises a die that includes the plurality of closed blocks, wherein the at least one processor is further configured to reset the die when the number of consecutive erase failures meets the threshold.

5. The storage device of claim 4, wherein the at least one processor is further configured to re-attempt to erase the plurality of closed blocks after resetting the die.

6. The storage device of claim 1, wherein, when the one or more of the plurality of closed blocks is successfully erased in response to the re-attempt, the at least one processor is further configured to identify the open block as a bad block.

7. The storage device of claim 6, wherein the at least one processor is further configured to:
store multiple lists of open blocks in the memory after multiple successful re-attempts to erase the plurality of closed blocks, and
identify the open block that is common across the multiple lists as the bad block.

8. A storage device, comprising:
a memory including non-volatile memory; and
a controller coupled to the memory and comprising at least one processor that is configured to execute instructions stored in the memory that causes the at least one processor to:
program an open block of the non-volatile memory,
perform an attempt to erase a plurality of closed blocks of the non-volatile memory after programming of the open block being programmed,
mark the plurality of closed blocks as bad blocks when the attempt to erase the plurality of closed blocks fails,
perform a re-attempt to erase the plurality of closed blocks when a number of consecutive erase failures associated with the attempt to erase the plurality of closed blocks meets a threshold, and
unmark the plurality of closed blocks as bad blocks when the re-attempt to erase the plurality of closed blocks is successful.

9. The storage device of claim 8, wherein the at least one processor is further configured to update an erase failure counter indicating the number of consecutive erase failures when the attempt to erase each of the plurality of closed blocks fails.

10. The storage device of claim 8, wherein the memory comprises a die that includes the plurality of closed blocks, wherein the at least one processor is further configured to send a reset command to the die when the number of consecutive erase failures meets the threshold.

11. The storage device of claim 10, wherein the at least one processor is further configured to perform the re-attempt to erase the plurality of closed blocks after transmitting the reset command.

12. The storage device of claim 8, wherein when each of the plurality of closed blocks is successfully erased in response to the re-attempt, the at least one processor is further configured to identify the open block as a bad block.

13. The storage device of claim 12, further comprising a memory, wherein the at least one processor is further configured to:

store a list of open blocks in the memory after each successful re-attempt to erase the plurality of closed blocks, and
identify the open block that is common across multiple lists of open blocks as the bad block.

14. A storage device, comprising:
a memory including non-volatile memory; and
a controller coupled to the memory and comprising at least one processor that is configured to execute instructions stored in the memory that causes the at least one processor to:
program an open block of the non-volatile memory,
perform an attempt to erase a plurality of closed blocks of the non-volatile memory after programming of the open block,
mark the plurality of closed blocks as bad blocks when the attempt to erase the plurality of closed blocks fails,
perform a re-attempt to erase the plurality of closed blocks when a number of consecutive erase failures associated with the attempt to erase the plurality of closed blocks meets a threshold, and
unmark each of the plurality of closed blocks as bad blocks when each of the plurality of closed blocks is successfully erased based on the re-attempt.

15. The storage device of claim 14, wherein the at least one processor is further configured to update an erase failure counter indicating the number of consecutive erase failures after each failed attempt to erase one of the plurality of closed blocks.

16. The storage device of claim 15, wherein the at least one processor is further configured to reset the erase failure counter after unmarking the plurality of closed blocks that successfully erased.

17. The storage device of claim 14, wherein the memory comprises a die that includes the plurality of closed blocks, wherein the at least one processor is further configured to reset the die before performing the re-attempt to erase the plurality of closed blocks.

18. The storage device of claim 14, wherein, when at least one of the plurality of closed blocks is successfully erased in response to the re-attempt, the at least one processor is further configured to identify the open block as a bad block.

19. The storage device of claim 18, wherein the at least one processor is further configured to:
store multiple lists of open blocks in the memory after multiple re-attempts to erase the plurality of closed blocks, and
identify the open block that is common across the multiple lists as the bad block.

* * * * *